(12) United States Patent
Takeuchi et al.

(10) Patent No.: US 6,898,025 B2
(45) Date of Patent: May 24, 2005

(54) PROJECTION ALIGNER AND OPTICAL SYSTEM THEREFOR

(75) Inventors: Shuichi Takeuchi, Saitama-ken (JP); Yutaka Takakubo, Saitama-ken (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 10/452,236

(22) Filed: Jun. 3, 2003

(65) Prior Publication Data

US 2003/0223127 A1 Dec. 4, 2003

(30) Foreign Application Priority Data

Jun. 4, 2002 (JP) ........................................ 2002-162603
Jun. 24, 2002 (JP) ........................................ 2002-183258

(51) Int. Cl.⁷ ............................................. G02B 17/00
(52) U.S. Cl. ..................................................... 359/732
(58) Field of Search ........................... 359/629, 726–736

(56) References Cited

U.S. PATENT DOCUMENTS

| | | | | |
|---|---|---|---|---|
| 4,497,617 A | * | 2/1985 | Price ............................ | 359/679 |
| 4,678,321 A | * | 7/1987 | Inokuchi ...................... | 355/52 |
| 4,896,952 A | * | 1/1990 | Rosenbluth ................. | 359/638 |
| 5,026,145 A | | 6/1991 | Marui et al. | |
| 5,062,692 A | | 11/1991 | Marui et al. | |
| 5,078,474 A | | 1/1992 | Marui et al. | |
| 5,559,629 A | * | 9/1996 | Sheets et al. ................ | 359/364 |
| 5,689,377 A | * | 11/1997 | Takahashi .................... | 359/727 |
| 5,729,331 A | | 3/1998 | Tanaka et al. | |
| 5,739,964 A | * | 4/1998 | Allen ............................ | 359/727 |
| 5,757,469 A | * | 5/1998 | Allen ............................ | 355/53 |
| 5,781,346 A | * | 7/1998 | Allen et al. .................. | 359/649 |
| 5,805,334 A | * | 9/1998 | Takahashi ..................... | 359/364 |
| 6,157,497 A | | 12/2000 | Kumazawa | |
| 6,351,305 B1 | | 2/2002 | Tanaka et al. | |
| 6,480,262 B1 | | 11/2002 | Tanaka et al. | |
| 6,509,954 B1 | | 1/2003 | Tanaka et al. | |
| 6,556,278 B1 | | 4/2003 | Tanaka et al. | |
| 6,665,126 B2 | * | 12/2003 | Shafer et al. ................. | 359/649 |
| 2003/0011755 A1 | * | 1/2003 | Omura et al. ................. | 355/67 |
| 2003/0095339 A1 | * | 5/2003 | Kobayashi et al. .......... | 359/726 |

FOREIGN PATENT DOCUMENTS

JP 7326557 12/1995

* cited by examiner

Primary Examiner—Ricky Mack
(74) Attorney, Agent, or Firm—Greenblum & Bernstein, P.L.C.

(57) ABSTRACT

A projection optical system, which is telecentric with respect to an object side and an image side, projects a pattern onto an image plane, which is substantially parallel with the pattern, at a substantial equi-magnification. The projecting optical system is provided with first and second condenser lenses having a common (first) optical axis which is perpendicular to the pattern and the image plane. The projection optical system further includes an imaging lens having a second optical axis that intersects with the first optical axis at an intermediate position between the first and second condenser lenses. A first mirror reflects a beam from the pattern and passed through the first condenser lens toward the imaging lens. A second mirror reflects the beam passed through the imaging lens to the imaging lens, and a third mirror reflects the beam passed through the imaging lens toward the second condenser lens.

18 Claims, 15 Drawing Sheets

PROJECTION ALIGNER AND OPTICAL SYSTEM THEREFOR

BACKGROUND OF THE INVENTION

The present invention relates to a projection aligner which is used for exposing a substrate to light through a mask to form a predetermined pattern thereon to manufacture printed circuit boards, liquid crystal display panels and the like in accordance with a photo-lithography method.

Conventionally, as the above-described projection aligner, a scanning type projection aligner has been widely used. The scanning type projection aligner is configured as follows.

That is, an image pattern formed on a mask is projected on a surface arranged substantially parallel with the mask at a substantially equi-magnification using a plurality of projecting optical systems. By moving the mask and the surface with respect to the projecting optical systems, the image of the pattern formed on the mask is formed on the surface. Typically, each projecting optical system projects light within a strip-shaped area. By connecting the plurality of strip-shaped areas, which are exposed to the light from a plurality of projecting optical systems, seamlessly, an image pattern is formed in a relatively wide area.

In order to project an image pattern at the equi-magnification, a predetermined object distance is required. If the lenses of the projecting optical system are arranged along a optical axis which is a single line, the size of the optical system in a direction perpendicular to the mask and the surface becomes relatively large. Accordingly, the apparatus employing such optical systems also becomes large.

Japanese Patent Provisional Publication No. HEI 7-326557 discloses an example of a projecting optical system which is configured to have a relatively small size. According to the publication, an optical axis of an imaging lens is arranged to be parallel with the mask and the surface to be exposed, and a right angle prism is arranged on one side of the imaging lens along the optical axis thereof, and a planar mirror is provided on the other side of the imaging lens. A beam from the mask is reflected by one surface of the right angle prism so that the reflected beam is incident on the imaging lens. The beam passed through the imaging lens is reflected by the planar mirror and is incident on the imaging lens again. The beam passed through the imaging lens twice is then reflected by another surface of the right angle prism and directed to the surface to be exposed. According to such a configuration, the size of the optical system in the direction perpendicular to the mask and the surface to be exposed can be reduced with respect to the same object distance.

The projecting optical system described above should be configured such that the diameter of the lens closest to the right angle prism should be larger than the size of the pattern to be projected if the optical system is an equi-magnification, and telecentric system. In particular, in order to achieve the high imaging performance by compensating for aberrations, it is preferable that the diameter of the lens is twice the pattern size. If a plurality of projecting optical systems are provided to connect the exposed areas seamlessly, the imaging lenses cannot be arranged in a single line, and should have a zigzag arrangement. Accordingly, although a room occupied by the optical systems is smaller in a direction perpendicular to the surface to be exposed, it becomes twice or more of the entire length of the imaging lens in the direction of the optical axes thereof.

Further to the above, there are cases where the projection magnification should be changed in order to compensate for expansion/reduction of the substrate due to the variation of the temperature and/or the magnification error in other processes.

The conventional projection optical system disclosed in the aforementioned publication is configured such that the beam travels through all the lens elements in back and forward directions. Therefore, if some of the lens elements are moved in the direction of the optical axis, the change in the optical characteristics due to the movement of the lens elements exhibit equally in both the object side and the image side. With such a configuration, it is relatively difficult to adjust the projection magnification.

SUMMARY OF THE INVENTION

The present invention is advantageous in that, even though the optical axes of the imaging lenses are arranged in parallel with the mask and the surface to be exposed and a mirror is used for directing the beam passed through the imaging lens to the surface to be exposed, the size of the imaging lenses in the direction of the optical axes thereof can be reduced.

Additionally, the present invention is advantageous in that, the projecting optical system is configured such that the optical axes of the imaging lenses are arranged in parallel with the mask and the surface to be exposed, and a mirror is used for directing the beam passed through the imaging lens to the surface to be exposed, and further, the projection magnification can be adjusted easily.

According to an aspect of the invention, there is provided a projection optical system which is telecentric with respect to an object side and an image side. The projection optical system projects a pattern on the object side onto an image plane, which is substantially parallel with the pattern, at a substantial equi-magnification. The projecting optical system is provided with a first condenser lens, a second condenser lens, the first and second condenser lenses having a first optical axis which is common between the first and second condenser lens and perpendicular to the pattern and the image plane. The projection optical system further includes an imaging lens having a second optical axis that intersects with the first optical axis at an intermediate position between the first and second condenser lenses, a first mirror that reflects a beam emerged from the pattern and passed through the first condenser lens toward the imaging lens, a second mirror that is provided in the vicinity of a pupil of the imaging lens and reflects the beam passed through the imaging lens toward the imaging lens, and a third mirror that reflects the beam reciprocally passed through the imaging lens toward the second condenser lens.

With this configuration, the size of the imaging lenses in the direction of the optical-axes thereof can be reduced.

In a certain case, a maximum outer diameter of the imaging lens is less than twice a width of an effective exposure area on the image plane. With an appropriate design, a maximum outer diameter of the imaging lens can be less than a width of an effective exposure area on the image plane.

In one example, the second mirror is a roof mirror.

In this case, the roof mirror is configured to have two mirror surfaces, a volley line formed between the two mirror surfaces extending substantially in parallel with the first optical axis.

According to a further aspect of the invention, a projection aligner is provided. The projection aligner includes a plurality of projecting optical system as described above.

The first condenser lens, the second condenser lens, the first mirror, the second mirror and the third mirror included in one of the plurality of projection optical systems and those included in another one of the plurality of projection optical systems next to the one of the plurality of projection optical systems are arranged at opposite positions with respect to the imaging lenses included therein.

According to another aspect of the invention, there is provided a projection optical system projecting a pattern on the object side onto an imaging surface, which is substantially parallel with the pattern. The projecting optical system is provided with a first optical element having an optical power, a second optical elements having an optical power, the first and second optical element having a first optical axis which is common between the first and second optical elements and perpendicular to the pattern and the imaging surface. Further, the projection optical system includes an imaging optical system having a second optical axis that intersects with the first optical axis at an intermediate position between the first and second optical elements, a first mirror that reflects a beam emerged from the pattern and passed through the first optical element toward the imaging optical element, a second mirror that is provided in the vicinity of a pupil of the imaging optical system and reflects the beam passed through the imaging optical system toward the imaging optical system, and a third mirror that reflects the beam reciprocally passed through the imaging optical system toward the second optical element. At least one of the first and second optical elements are configured to be movable in a direction of the first optical axis so as to adjust a magnification of an image projected on the imaging surface.

With this configuration, the projection magnification can be adjusted easily.

Optionally, at least one of the pattern and the imaging surface may be movable in the direction of the first optical axis, a focusing condition of the image on the imaging surface being adjustable by moving at least one of the pattern and the imaging surface in the direction of the first optical axis.

Further optionally, at least one of the first and second optical elements may be movable in a direction perpendicular to the first optical axis and parallel with the second optical axis, distortion of an image formed on the imaging surface being compensated for by moving the at least one of the first and second optical elements in a direction perpendicular to the first optical axis and parallel with the second optical axis.

Still optionally, at least one of the first and second optical elements may be movable in a direction perpendicular to the first optical axis and perpendicular to the second optical axis so that a position of the image formed on the imaging surface is adjustable in a direction perpendicular to both the first and second optical axes.

Furthermore, the second mirror may be a planar mirror having one reflection surface, the second mirror being rotatable about an axis parallel with the first optical axis, a position of the image on the imaging surface in a direction perpendicular to both the first and second optical axes being adjustable by rotating the second mirror.

Still optionally, the second mirror may be rotatable about an axis perpendicular to both the first and second optical axes, a position of the image on the imaging surface being adjustable in a direction parallel to the second optical axis by rotating the second mirror.

In this case, the second mirror may be a roof mirror having two reflection surfaces, a volley line between the two reflection surfaces being included in a plane including the first optical axis and the second optical axis.

Optionally, the second mirror may be configured to have two reflection surface forming a right angle. Further, the second mirror may be movable about the second optical axis so as to adjust an inclination of the image on the imaging surface.

In a certain case, both of the first and second optical elements has a positive power. Particularly, the first and second optical elements may function as condenser lenses, the projection optical system being telecentric with respect to the pattern side and the imaging surface side.

According to a further aspect of the invention, there is provided a scanning type projection aligner that projects a pattern formed on a pattern onto an imaging surface using a plurality of projection optical systems, the imaging surface being substantially parallel with the mask, each of the projecting optical system is configured as described above, and the plurality of projection optical system may be aligned in an a direction perpendicular to both the first and second optical axes.

BRIEF DESCRIPTION OF THE ACCOMPANYING DRAWINGS

DETAILED DESCRIPTION OF THE EMBODIMENT

Hereinafter, projecting optical systems according to embodiments of the invention will be described with reference to the accompanying drawings.

Figure 1:
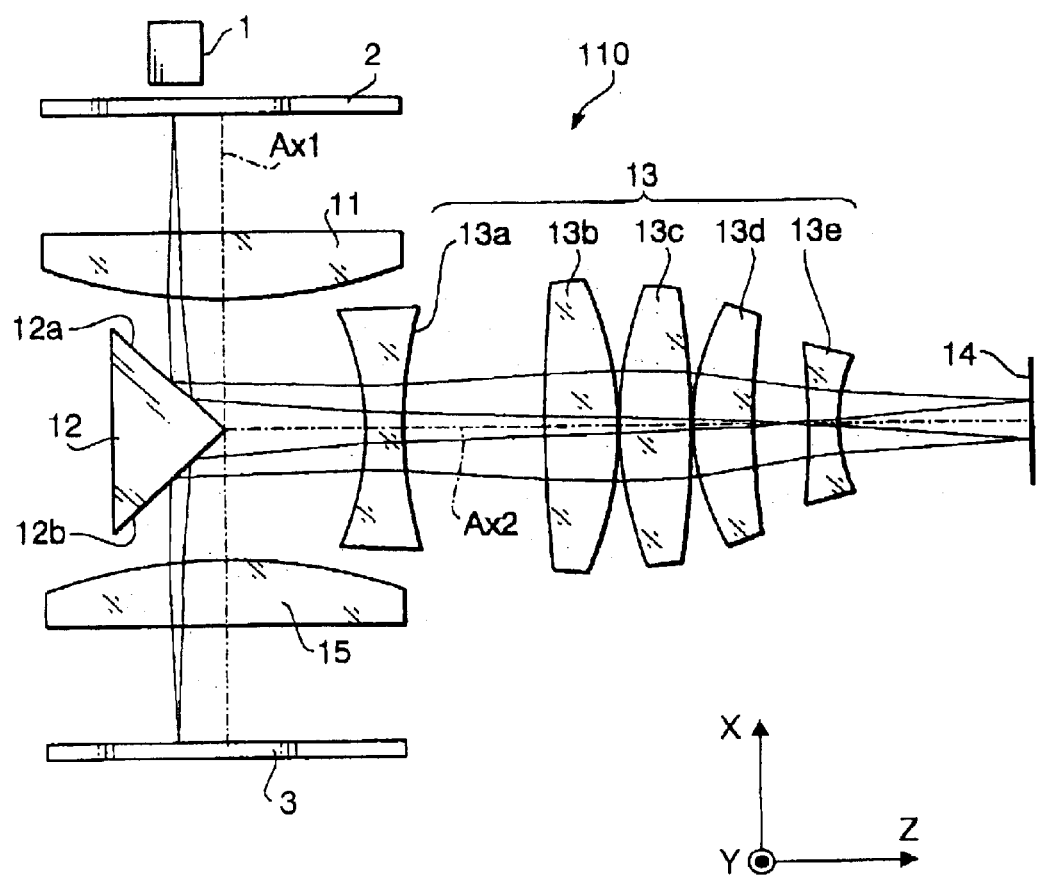
FIG. 1 is a lens diagram showing a structure of a projecting optical system according to a first embodiment.
Figure 2:
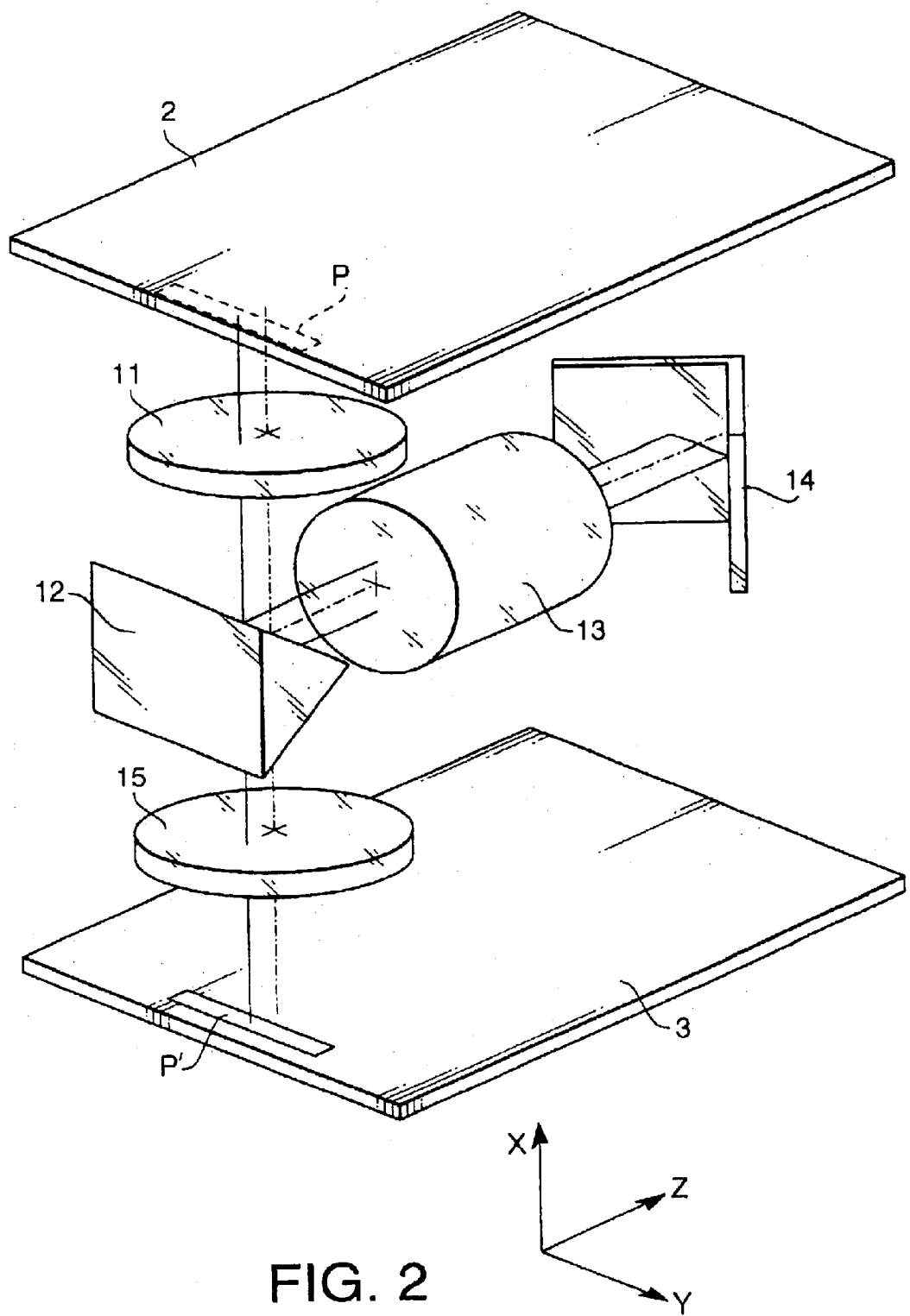
FIG. 2 is a perspective view of the projecting optical system shown in FIG. 1.
Figure 3:
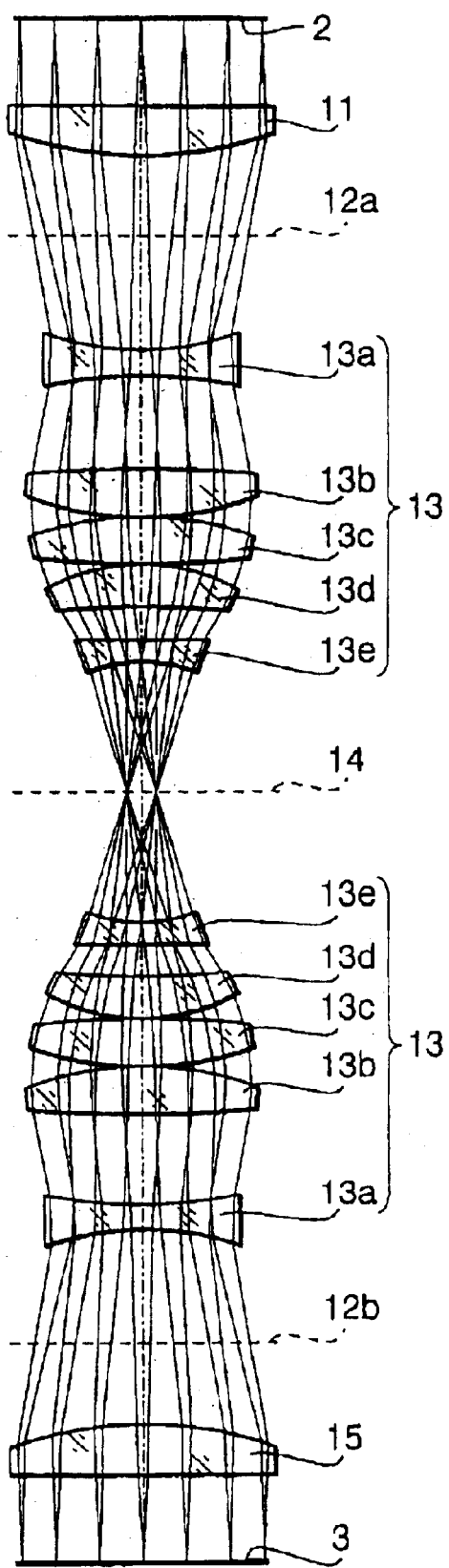
FIG. 3 is a lens diagram showing a developed optical path of the projecting optical system shown in FIG. 1.
Figure 3:
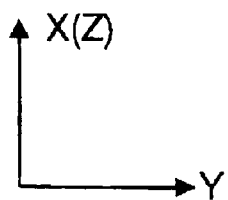

FIG. 1 is a lens diagram showing a structure of a projecting optical system 110 according to a first embodiment. FIG. 2 is a perspective view of the projecting optical system 110 shown in FIG. 1, and FIG. 3 is a lens diagram showing a developed optical path of the projecting optical system 110 shown in FIG. 1.

In the projecting optical system 110, light emitted by an illuminating optical system 1 and passed through a mask 2 is projected on a plate 3 which is arranged substantially parallel with the mask 2 so that a pattern formed on the mask 2 is projected on the plate 3 as a substantially equi-magnification image. The mask 2 is a transparent substrate on which, for example, a predetermined circuit pattern is formed. The plate 3 is, for example, a substrate for a printed circuit board on which photosensitive material such as photo resist is applied. As the pattern formed on the mask 2 is projected on the plate 3 via the projecting optical system 110, the photosensitive material on the plate 3 is exposed to the light, thereby the pattern is transferred on the plate 3.

The projecting optical system 110 is configured to be telecentric with respect to either an object side or a plate (image) side.

As shown in FIG. 1, the projecting optical system 110 includes:

first and second condenser lenses 11 and 15 having a common optical axis, which will be referred to as a first optical axis Ax1 substantially perpendicular to the mask 2 and the plate 3;

an imaging lens 13 having a second optical axis Ax2 which intersects with the first optical axis Ax1 at an intermediate position between the first and second condenser lenses 11 and 15;

a first mirror 12a which reflects a beam emerged from the mask 2 and passed through the first condenser lens 11 toward the imaging lens 13;

a second mirror 14 which is arranged in the vicinity of a pupil of the imaging lens 13 to reflects the light beam passed through the imaging lens 13 to enter the imaging lens again; and a third mirror 12b which reflects the light beam reciprocated in the imaging lens 13 to enter the second condenser lens 15.

For the sake of description, a three-dimensional coordinate (XYZ coordinate) is defined In the drawings. The X-axis is parallel with the first optical axis Ax1, the Z-axis is parallel with the second optical axis Ax2, and the Y-axis is perpendicular to both the first and second optical axes Ax1 and Ax2.

The first condenser lens 11 arranged on the mask 2 side is a plano-convex lens, a planar surface thereof facing the mask 2. The diameter of the first condenser lens 11 is greater than the size of a pattern P (see FIG. 2) to be projected. The second condenser lens 15 arranged on the plate 3 side is also the plano-convex lens which has the same design as the first condenser lens 11, the planar surface thereof facing the plate 3. Between the second condenser lens 15 and the plate 3, a field stop (not shown) restricting an area where the image is projected is provided.

The first and third mirror 12a and 12b are configured as a single element by applying a reflection coating onto surfaces of the right angle prism 12 arranged between the condenser lenses 11 and 15, The right angle prism 12 is arranged such that a ridge line at the boundary between the first and third mirrors 12a and 12b is parallel with the Y-axis and passes an intersection of the first and second optical axes Ax1 and Ax2.

The imaging lens 13 is configured to include a bi-concave first lens 13a, a bi-convex second lens 13b, a bi-convex third lens 13c, a positive meniscus fourth lens 13d and a bi-concave fifth lens 13e.

The second mirror 14 is a roof mirror, as shown in FIG. 2, having two reflection surfaces facing each other with a right angle formed therebetween. Generally, a roof mirror is configured that a pair of two mirrors are arranged to form a certain angle with one end sides thereof being contacted. It should be noted that according to the embodiments, the roof mirror may be configured such that two mirrors are slightly spaced. That is, a "ridge" portion of the "roof" may include a clearance. A ridge line defined at the top of the "roof" (when the reflection surfaces contact each other, a line where the two reflection surfaces intersect) is parallel with the first optical axis Ax1.

When the plate 3 is exposed to the light, the projecting optical system 1 is driven to emit light, thereby a pattern in a predetermined area P of the mask is projected in the area P' on the plate 3 as an equi-magnification image via the projecting optical system 110. In order to employ a plurality of projecting optical systems 110 to project images on a plurality of seamlessly connected areas on the plate 3 simultaneously, each projecting optical system 110 is required to form an erected image. If the condenser lens and the imaging lens are used, an inversed image is formed. According to the embodiment, with use of the roof mirror as the second mirror 14, an erected image of the pattern on the mask 2 can be formed on the plate 3. By moving the plate 3 together with the mask 2 at the same speed in the Z-axis direction, the pattern on the mask can be projected within a rectangular area (a strip shaped area) having a width of P'.

According to the above-described structure, the optical system forms an equi-magnification image and is configured as a telecentric system, while only the first and second condenser lenses are required to have a larger size than the pattern to be projected, and the diameter of the imaging lens 12 can be made smaller in comparison with the conventional system.

FIG. 3 is lens diagram with the optical path being developed. According to the embodiment, the maximum outer diameter of the imaging lens 13 is less than twice the effective exposure width. With this configuration, a plurality of optical systems may be arranged similarly to the arrangement employed in the Japanese Patent Provisional Publication HEI 07-326557. In a particular case, the maximum outer diameter of the imaging lens 13 is less than the effective exposure width. With this configuration, the arrangement as shown in FIG. 5 can be employed, which will be described later.

From FIG. 3, a relationship between the diameters of the lens elements included in the projecting optical system 110 is derived. As shown in FIG. 3, the diameters of the lens elements of the imaging lens 13 are smaller than the maximum size of the pattern P projected on the mask 2, i.e., the effective exposure width on the plate 3. As indicated in FIG. 3, the diameters of the first and second condenser lenses 11 and 12 are slightly greater than the size of the pattern P on the mask 2. It should be noted that the effective exposure width in this specification means a width of the pattern P in the Y-axis direction (in FIG. 3), which is perpendicular to the first and second optical axes.

Figure 4:
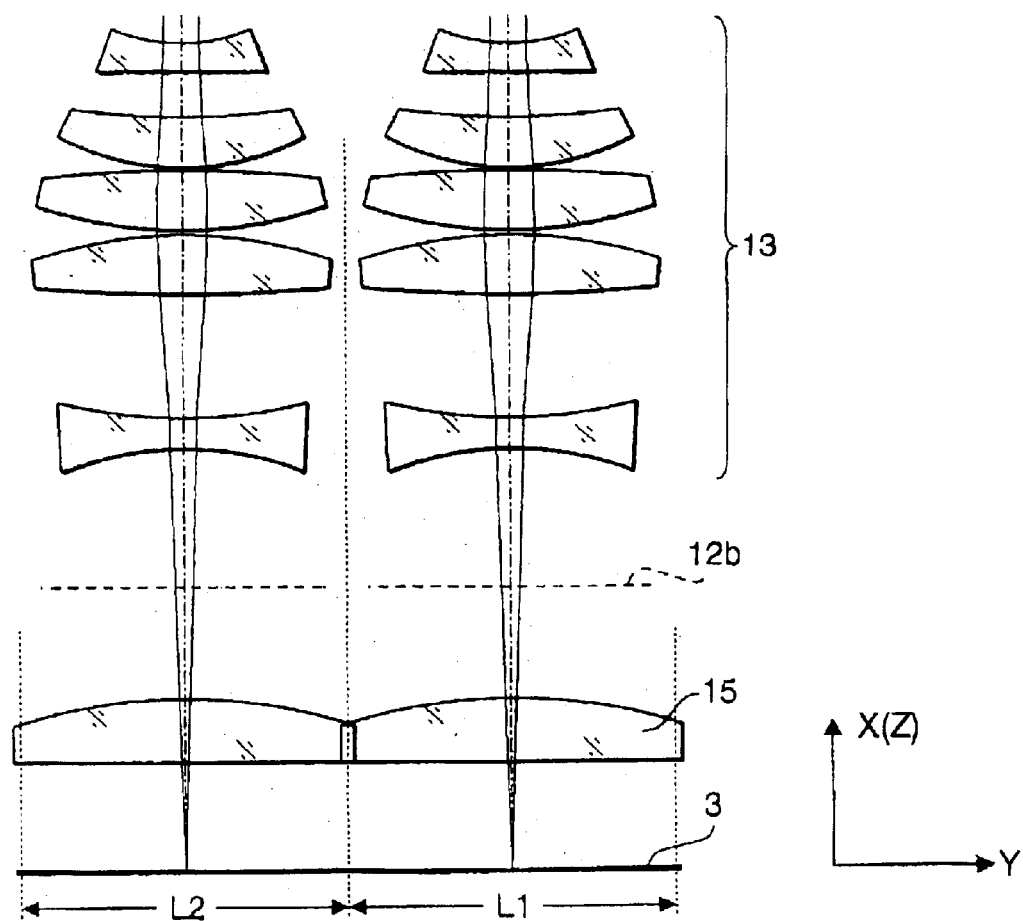
FIG. 4 is a developed view of a plate side part of the projecting optical system with respect to a second mirror.

Since each optical system is configured as described above, when a plurality of optical systems are arranged to connect the exposure areas L1 and L2 seamlessly (see FIG. 4), two imaging lenses 13 and 13 can be aligned next to each other, and no interference occurs therebetween. FIG. 4 shows a plate 3 side portion, with respect to the second mirror 4, of the projecting optical system 110. As shown in FIG. 4, although the imaging lenses 13 do not interfere with each other, the condenser lenses 15 and 15 interfere with each other if they are arranged along a line extending in the Y-axis direction. Accordingly, the condenser lenses 15 and 15 have a zigzag arrangement, i.e., they are shifted in the Z axis direction.

Figure 5:
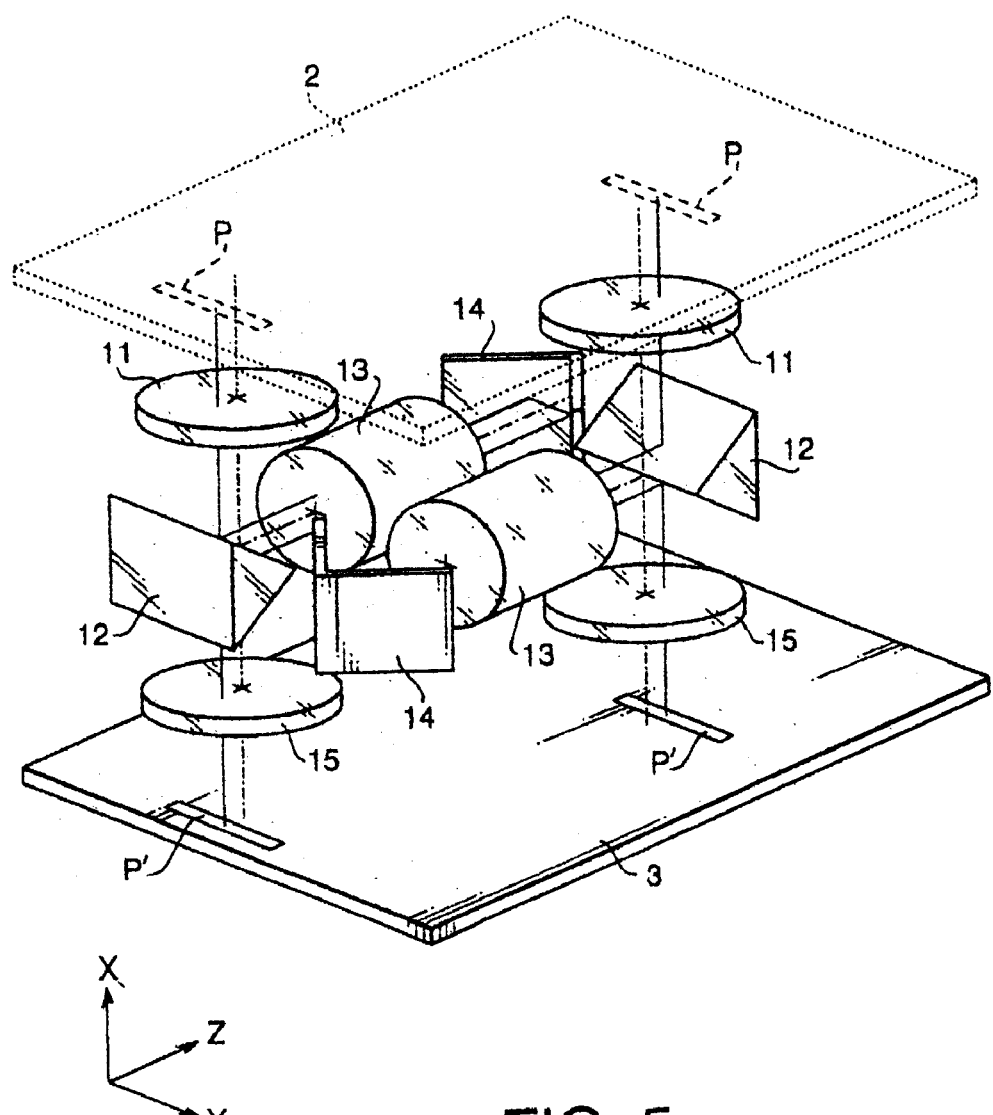
FIG. 5 is a perspective view showing an exemplary configuration of a scanning type projecting aligner having two projecting optical systems.

FIG. 5 schematically shows a structure of an example of the scanning type projection aligner employing two projecting optical systems 110 described above. The imaging lenses 13 are arranged in the Y-axis direction such that the optical axes thereof are parallel to each other. The condenser lenses 11 and 15, the right angle prism 12, the second mirror 14 of one of the projecting optical systems 110 are arranged at opposite positions, with respect to the imaging lenses 13, to those of the other projecting optical system 110. With this arrangement, the size of the entire optical system in the Z-axis direction can be reduced in comparison with the conventional projection aligner.

Figure 6:
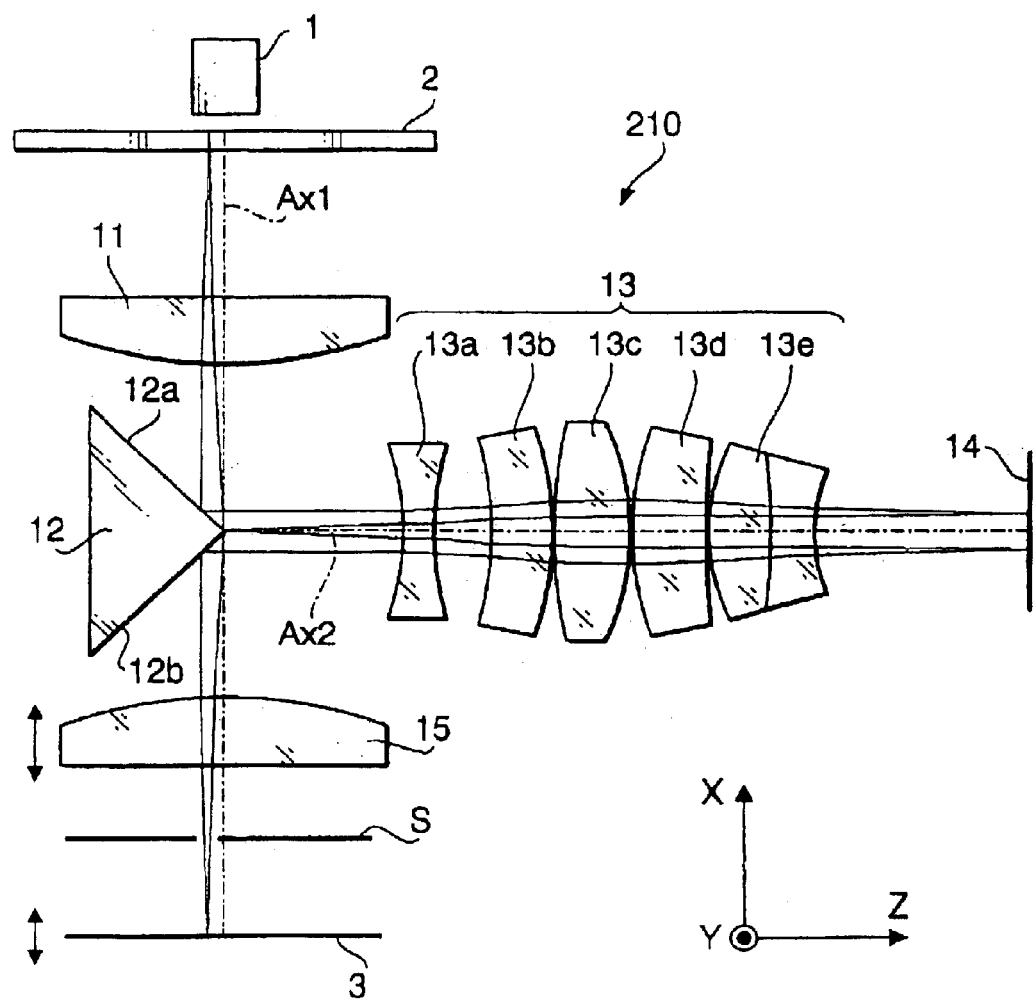
FIG. 6 is a lens diagram showing a structure of a projecting optical system according to a second embodiment.
Figure 7:
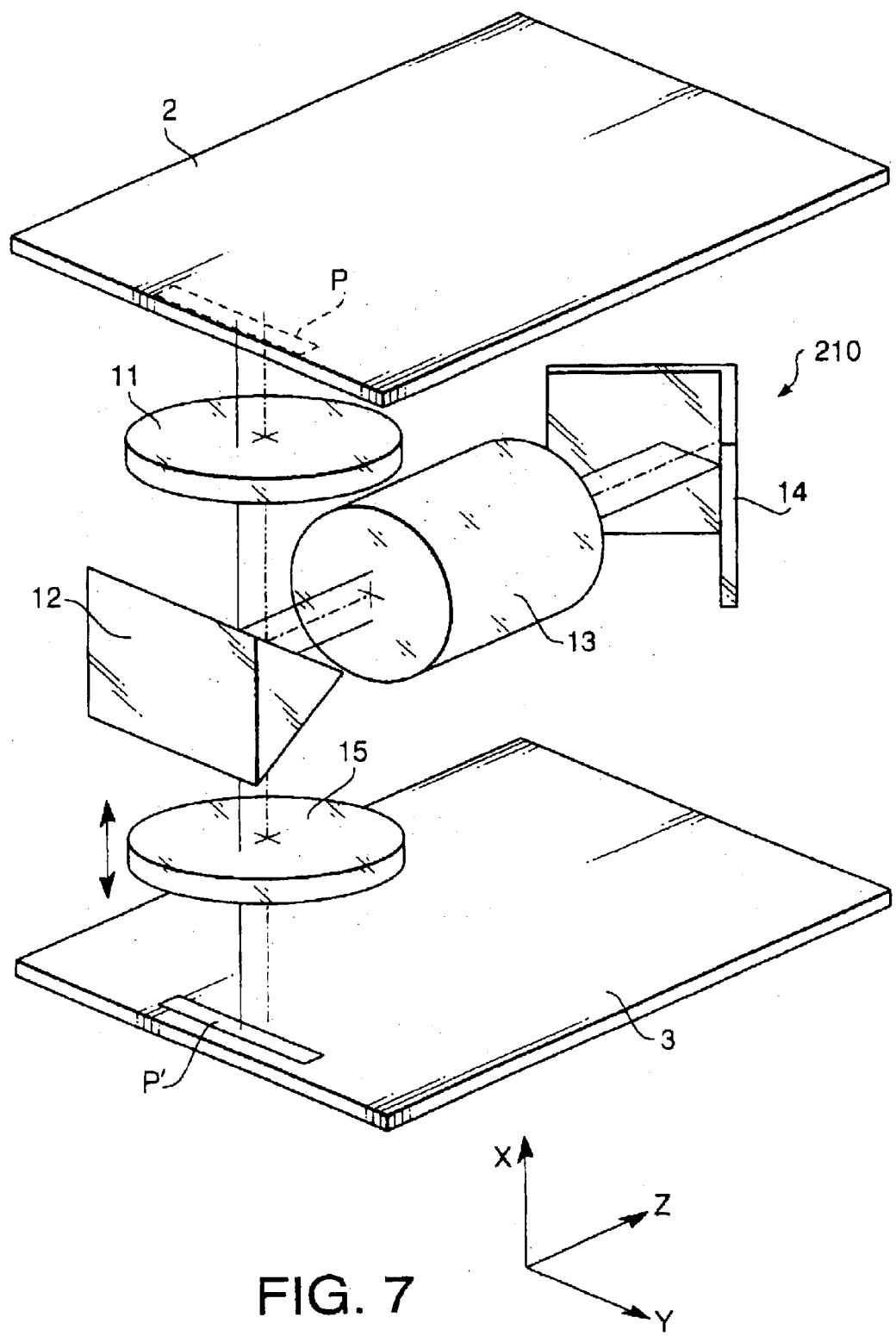
FIG. 7 is a perspective view of the projecting optical system shown in FIG. 6.
Figure 8:
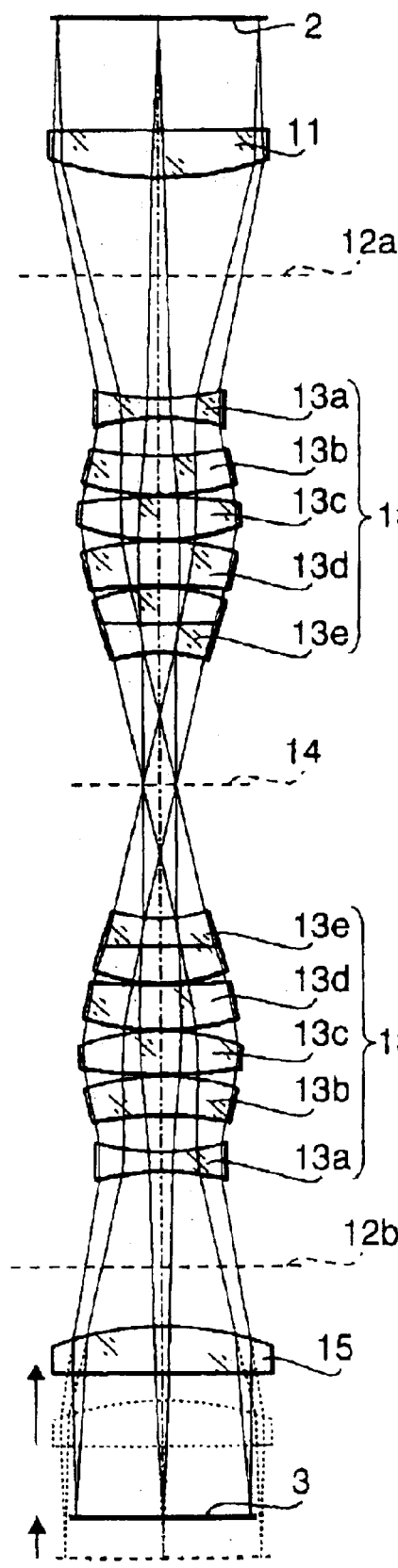
FIG. 8 is a lens diagram showing a developed optical path of the projecting optical system shown in FIG. 6.

FIG. 6 is a lens diagram showing a structure of a projecting optical system 210 according to a second embodiment. FIG. 7 is a perspective view of the projecting optical system 210 shown in FIG. 6, and FIG. 8 is a lens diagram showing a developed optical path of the projecting optical system 210 shown in FIG. 6.

The schematic configuration of the projecting optical system 210 is substantially the same as that of the projecting optical system 110 according to the first embodiment, except that the second condenser lens 15 is configured to be movable along the first optical axis Ax1, and the configuration of the imaging lens 13 is different. Further, the plate 3 is also movable in the direction of the optical axis Ax1. As shown in FIG. 6, a field stop S for restricting the area on the plate to be exposed to light is provided between the second condenser lens 15 and the plate 3.

The imaging lens 13 has, from the rectangular prism side, a bi-concave fist lens 13a, a positive meniscus second lens 13b, a bi-convex third lens 13c, a positive meniscus fourth lens 13d and a cemented lens 13e, which is constructed such that a positive lens and a negative lens are cemented.

According to the second embodiment, the optical system forms substantially an equi-magnification image and is configured as a telecentric system, while only the first and second lenses are required to have a larger size than the pattern to be projected, and the diameter of the imaging lens 13 (each of the lens elements 13a–13d) can be made smaller in comparison with the conventional system.

When the expansion/contraction of the plate 3 due to the variation of the temperature and/or the magnification error caused in other processes is compensated for, firstly, the second condenser lens 15 is moved in the direction of the first optical axis Ax1 as indicated by arrow in FIG. 7. With this movement, the projection magnification is changed and the size of the projected image is changed. When the second condenser lens 15 is moved, however, the image becomes defocused By moving the plate 3 in the direction of the first optical axis Ax1, the image can be brought into an in-focus condition.

The adjustment of the magnification will be described in detail with reference to FIGS. 8–11.

Figure 9:
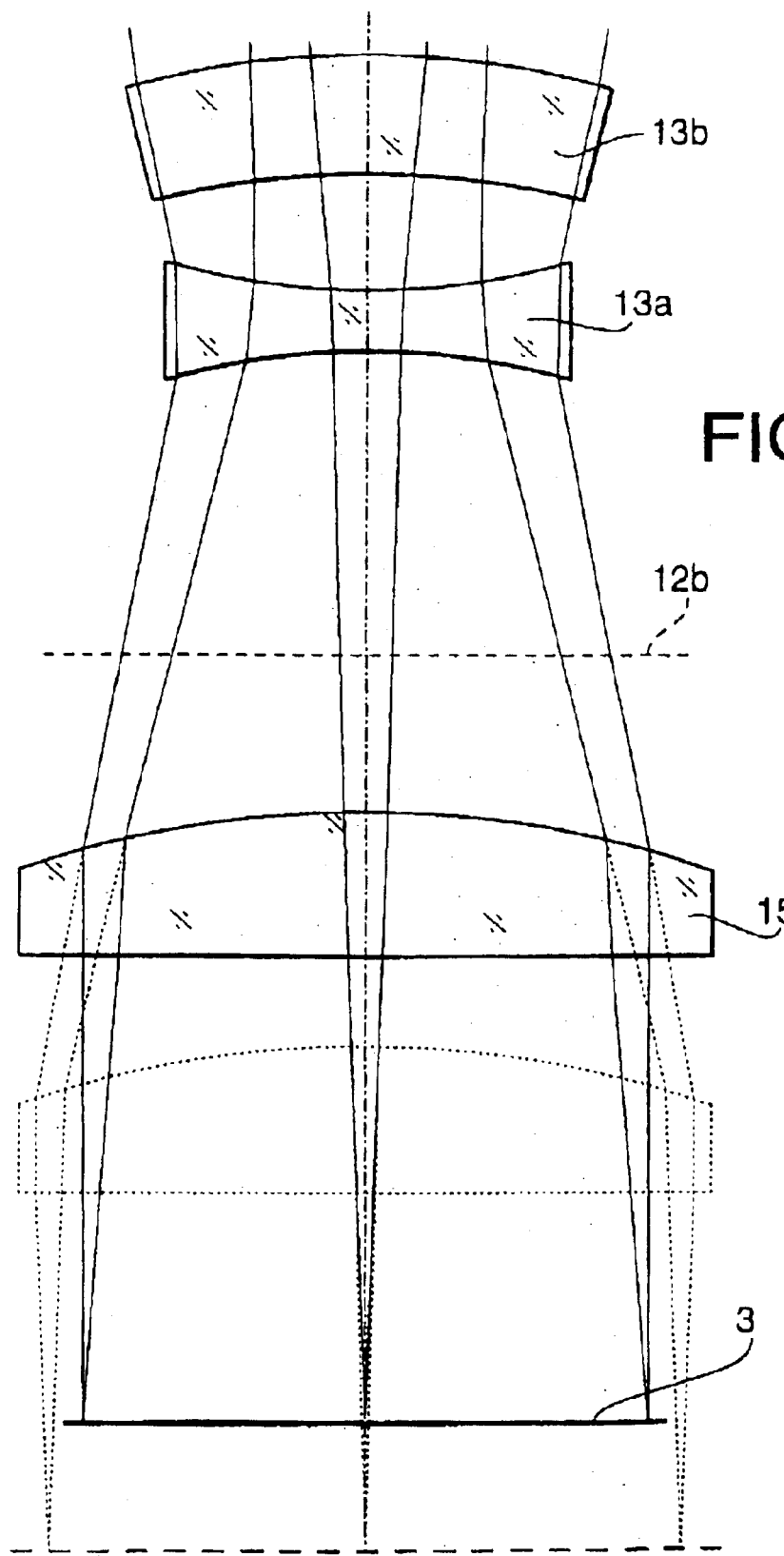
FIG. 9 is an enlarged view of a part of the lens diagram shown in FIG. 8.

FIG. 8 is a lens diagram of the projecting optical system 210 with the optical path being developed. FIG. 9 is an enlarged view of a part of the lens diagram shown in FIG. 8.

The optical path on the plate side with respect to the second condenser lens 15 changes when the magnification is changed. The second condenser lens 15 and plate 3 are located at positions indicated by broke lines in. FIGS. 8 and 9 when the pattern is projected with equi-magnification. The optical path at the equi-magnification condition is also indicated with broken lines in FIGS. 8 and 9.

When the magnification is reduced to form a smaller image, the second condenser lens 15 is moved, along the first optical axis Ax1, in an upper direction in FIGS. 8 and 9, for example to the position indicated by solid line. Then, the light rays proceed as indicated by the solid lines, and the area within which the image is formed is reduced. However, when the second condenser lens 15 is moved, the image plane shifts along the direction of the first optical axis Ax1, and the image is blurred if the plate 3 stays the same position (i.e., the position indicated by the broken lines). By moving the plate 3 in the direction of the first optical axis Ax1, for example to the position indicated by solid line in FIGS. 8 and 9, the image is brought into the in-focus condition. Alternatively or optionally, the mask 2 may be configured to movable in the direction of the first optical axis Ax1 for adjusting the focusing condition.

When the power of the second condenser lens 15 is relatively strong, or when the moving amount of the second condenser lens 15 for the magnification adjustment is relatively large, distortion may occur (i.e., the image may be curved). Such a situation, and compensation thereof will be described hereinafter with reference to FIGS. 10 and 11.

Figure 10:
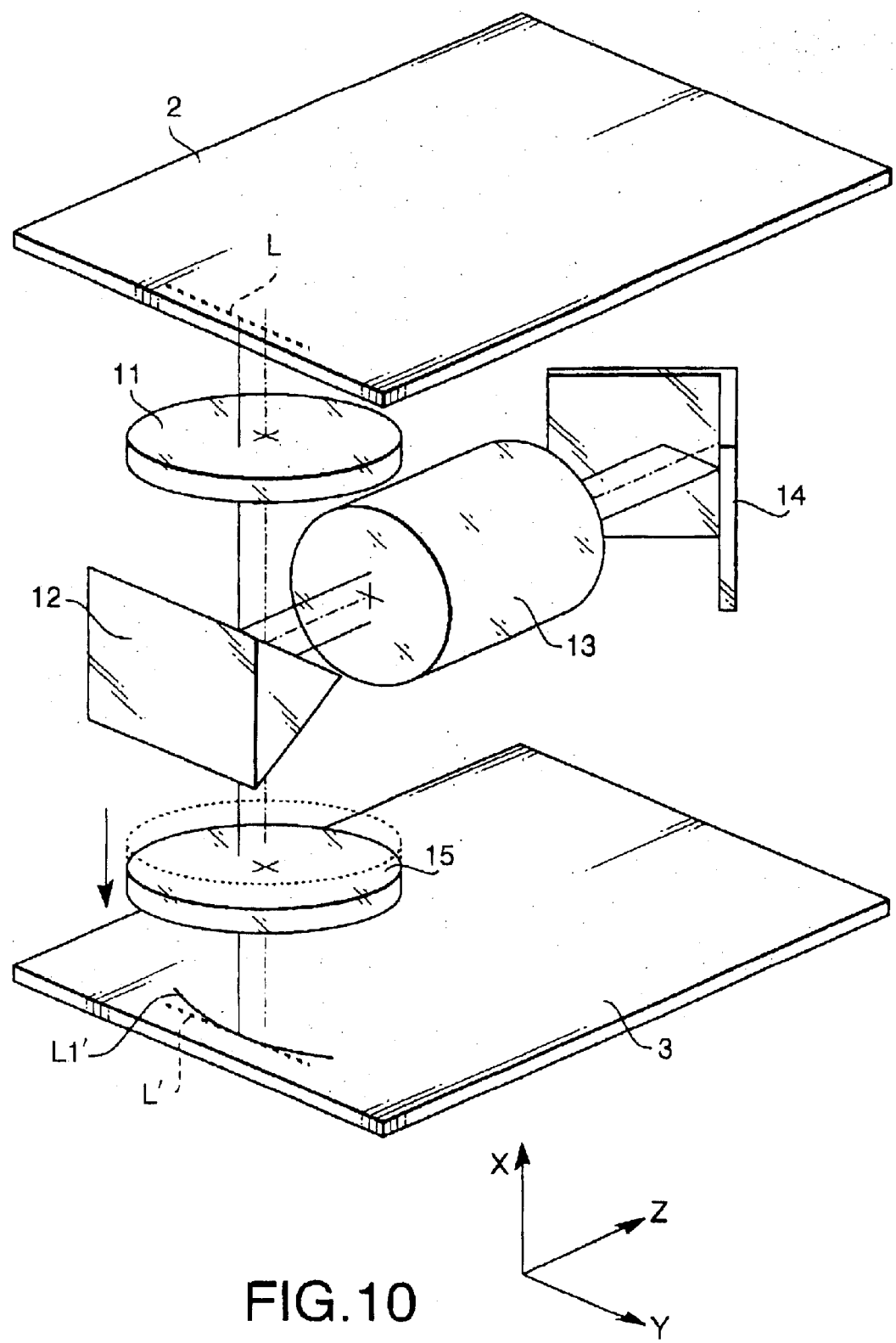
FIG. 10 is a perspective view of the projection optical system illustrating an adjustment of a magnification.
Figure 11:
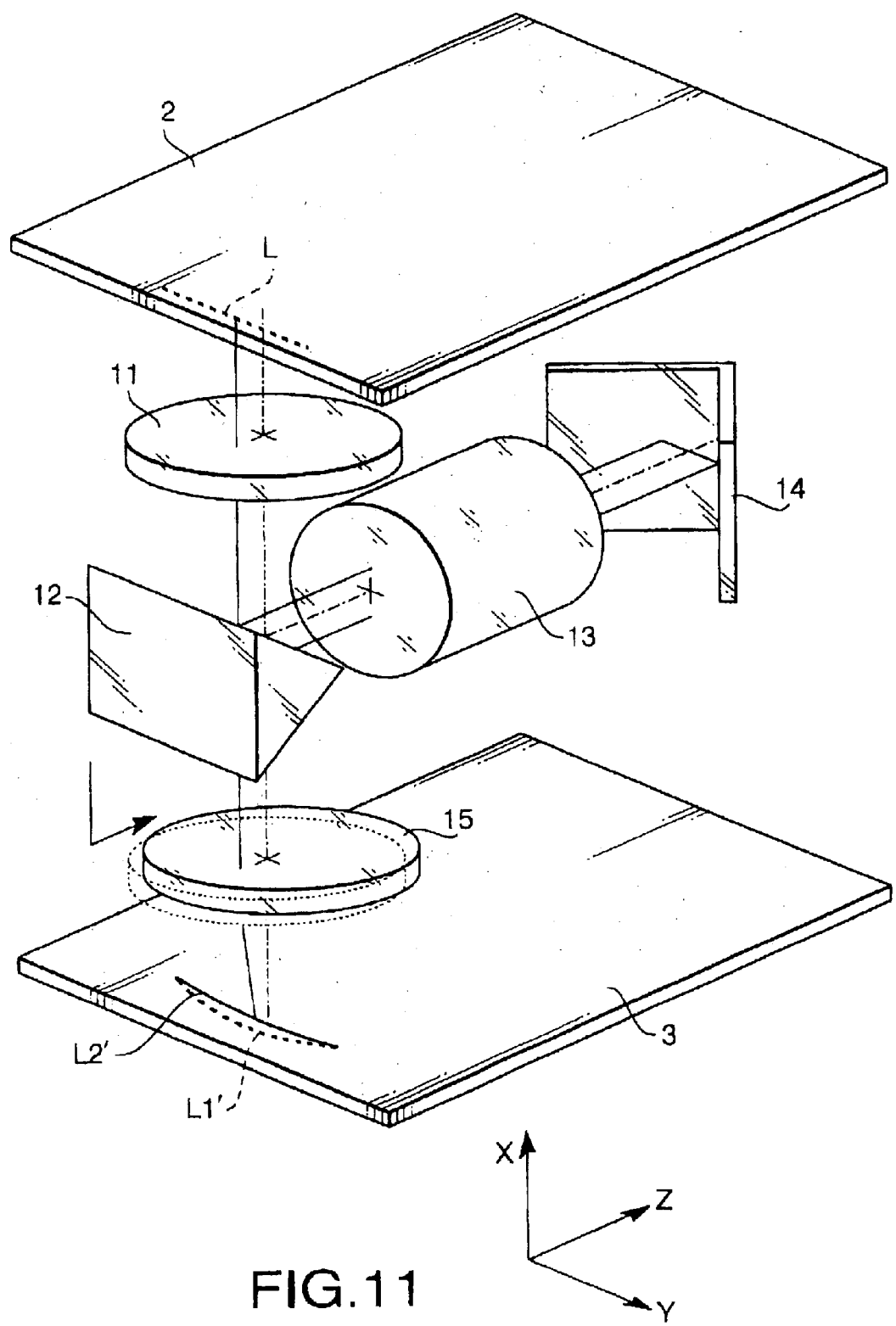
FIG. 11 is a perspective view of the projection optical system illustrating compensation for distortion.

FIGS. 10 and 11 are perspective views of the projecting optical system 210. For the brevity, a case where a line segment pattern L on the mask 2 is projected on the plate 3 will be described.

FIG. 10 shows a case where the second condenser lens 15 is moved, along the first optical axis Ax1, toward the plate 3, so as to increase the magnification. At the equi-magnification condition, the line segment pattern L on the mask 2 is projected as the line segment image L' on the plate as indicated by broken lines in FIG. 10. When the second condenser lens 15 is moved as indicated by solid line in FIG. 10, the image may curve as shown by solid line L1'. If the distortion appears, the pattern on the mask 2 cannot be projected correctly on the plate 3.

In such a case, as shown in FIG. 11, the second condenser lens 15 is moved in a direction perpendicular to the first optical axis Ax1 and parallel with the second optical axis Ax2 (i.e., in the Z-axis direction). In FIG. 11, the position of the second condenser lens 15 and the image of the line segment pattern before the distortion is corrected are indicated by broken lines, and those after the compensation are indicated by solid lines. Thus, the image L1' exhibits distortion, and the compensated image is indicated by L2'. By moving the second condenser lens 15 in the Z-axis direction, the curvature of the image L1' is reduced and the image L2' which is close to a line segment image is formed.

Next, the adjustment of a position of the image in the Y-axis direction, an inclination in a Y-Z plane, and a position in the Z-axis direction when the magnification adjustment is performed or independent of the magnification adjustment will be described with reference to FIGS. 12–14.

Figure 12:
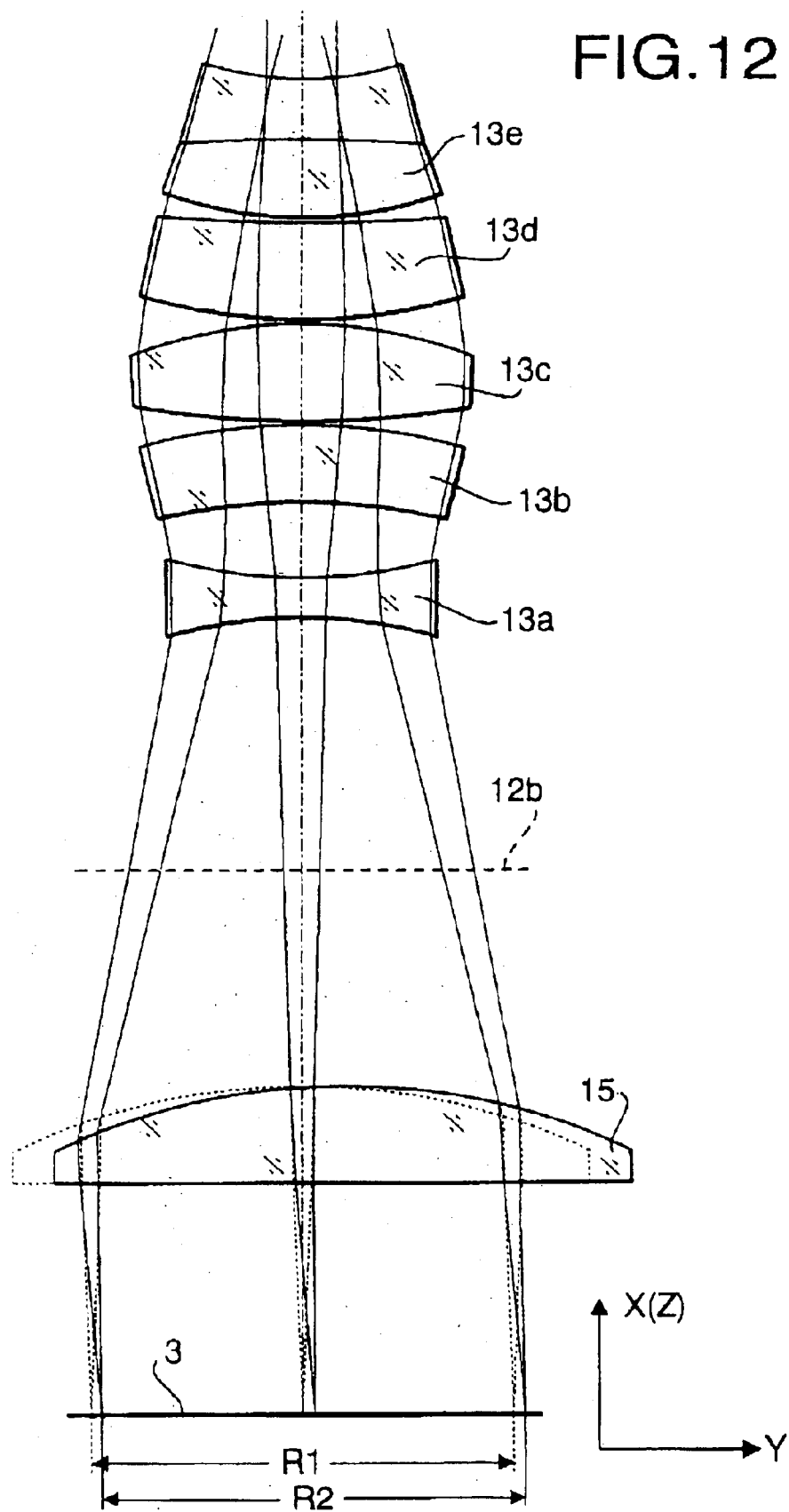
FIG. 12 is a perspective view of the projection optical system illustrating an adjustment of a position of an image in the Y-axis direction.

The position of the image in the Y-axis direction can be adjusted by moving the second condenser lens 15 in the Y-axis direction as illustrated in FIG. 12. When the second condenser lens 15 is located at a position indicated by broken lines, the rays proceed as indicated by the broken lines and an image is formed in an area R1 on the plate 3. Then, when the second condenser lens 15 is moved to the position indicated by the solid lines, the paths of the rays proceed as indicated by solid lines, thereby an image being formed within a area R2 on the plate 2. Thus, when the second condenser lens 15 is moved in the Y-axis direction, the area in which the image is formed also moves in the Y-axis direction, from R1 to R2.

Figure 13:
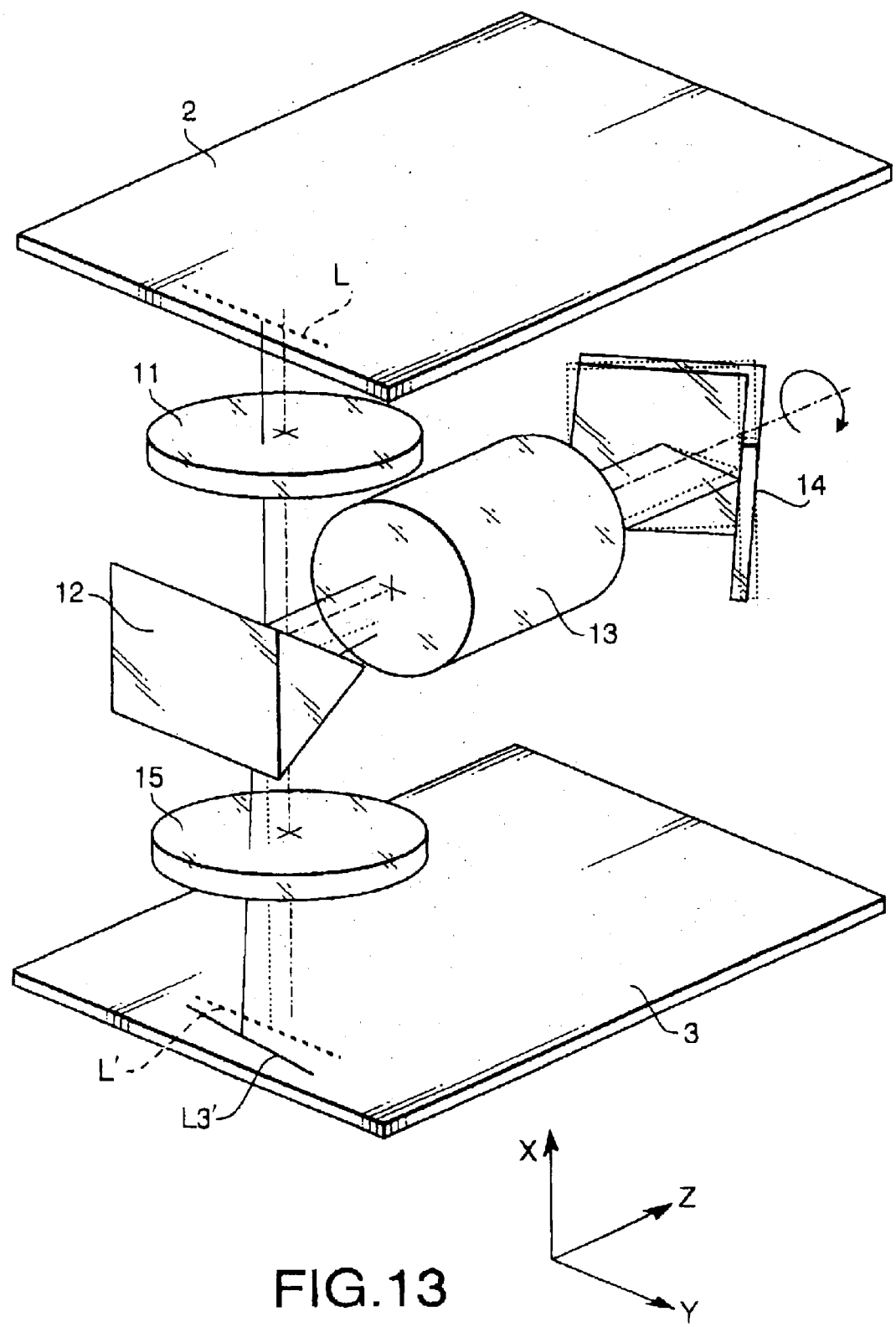
FIG. 13 is a perspective view of the projection optical system illustrating an adjustment of an inclination of the image.
Figure 14:
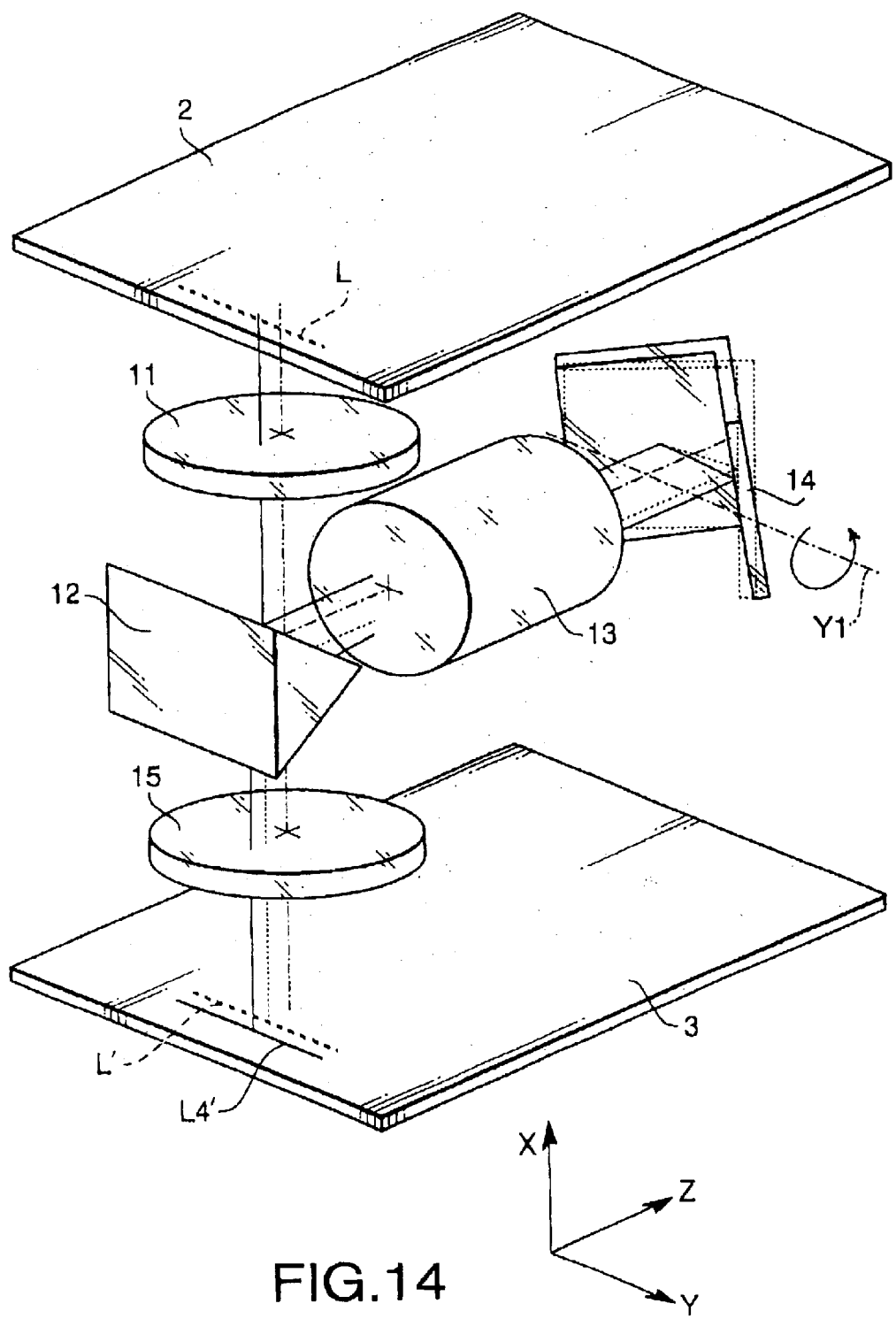
FIG. 14 is a perspective view of the projection optical system illustrating an adjustment of a position of the image in the Z-axis direction.

The inclination of the image in the Y-Z plane can be adjusted by rotating the second mirror 14 about the second optical axis Ax2 as illustrated in FIG. 13. Assuming that the second mirror 14 is located at a position indicated by the broken lines in FIG. 13 before the compensation, the rays proceed as indicated by the broken lines, and the line segment pattern L on the mask 2 is projected as the line segment image L1' on the plate 3. When the second mirror 14 is rotated about the second optical axis Ax2 so as to be located at a position indicated by the solid lines in FIG. 13, the rays proceed as indicated by the solid lines, and form an image L3' which is inclined with respect to the image L' in the Y-Z plane.

The position of the image in the Z-axis direction can be adjusted by rotating the second mirror 14 about an axis which is perpendicular to both the first and second optical axes Ax1 and Ax2, i.e., about an axis parallel with the Y-axis direction. When the second mirror 14 is located at a position indicated by the broken lines in FIG. 14, the pattern L on the mask 2 is projected as the image L' on the plate 3. When the second mirror 14 is rotated about an axis Y1 extending in the Y-axis direction as indicated in FIG. 14, the optical path changes as indicated by the solid lines in FIG. 14, and image L' is moved in the Z-axis direction and is located at a position indicated by the solid line as the image L4'.

The projecting optical system 210 according to the second embodiment can be employed in the projection aligner show in FIG. 5.

Figure 15:
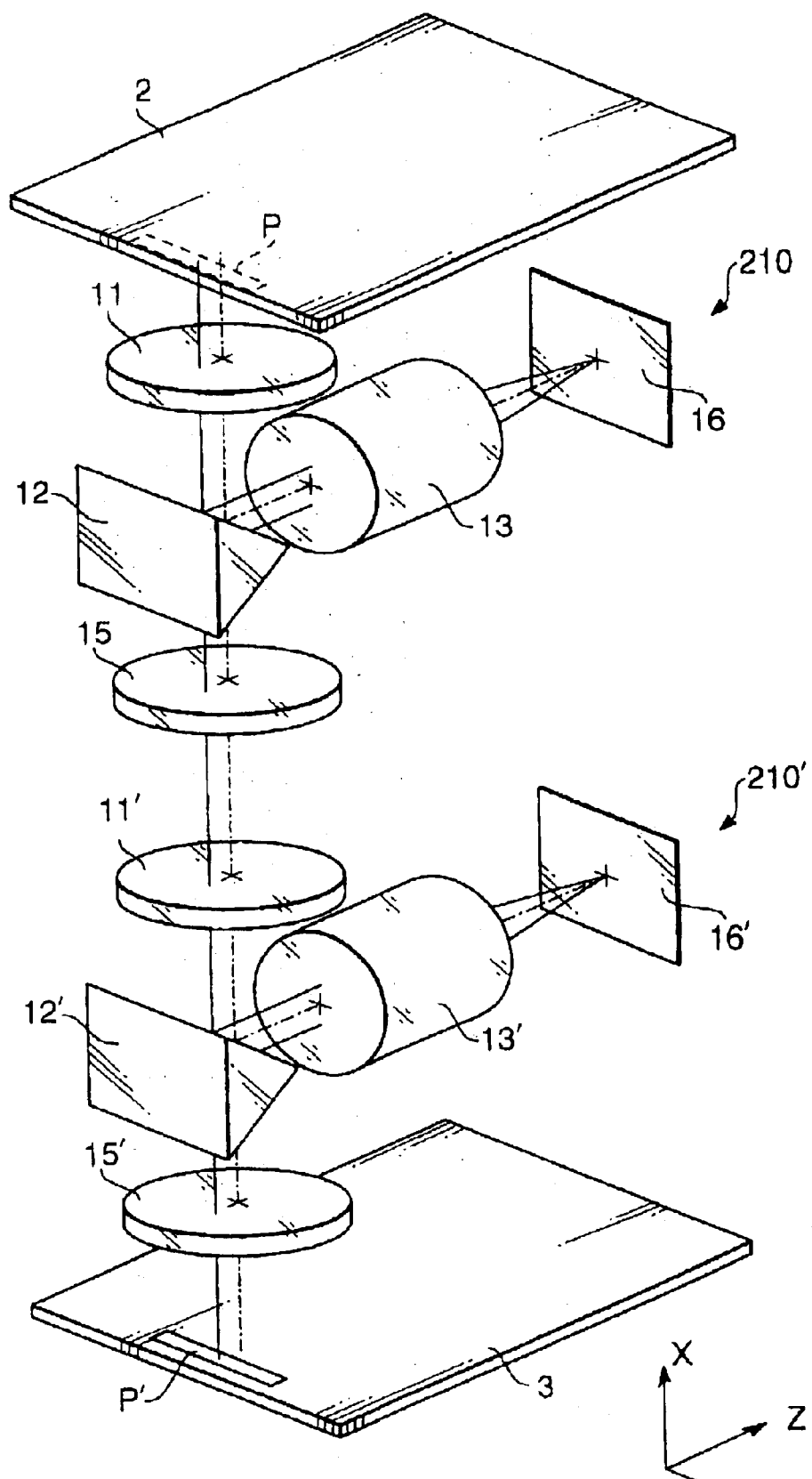
FIG. 15 is a perspective view showing an exemplary configuration of a position aligner.

FIG. 15 shows another configuration of the projection aligner. In this configuration, as the second mirror, a planar mirror having one reflection surface is employed instead of the roof mirror 14. When the roof mirror 14 is used, in combination with the first condenser lens 11, the imaging lens 13 and the second condenser lens 15, an erected image can be formed only by converging the light beam once.

If the, planar mirror 16 is used as shown in FIG. 15 as the second mirror, if the light beam is converged once, an inversed image is formed. Thus, in the configuration shown in FIG. 15, the projecting optical system 210 from the first condenser lens 11 to the second condenser lens 15 via the imaging lens 13 and another projecting optical system 210' having a similar structure as the projecting optical system 210 are connected serially, an erected image is formed by converging the light beam twice.

The projecting optical systems 210 and 210' have planar mirror 16 and 16' as the second mirrors. The second mirror 16' of the projecting optical system 210' is configured to be rotatable about an axis parallel with the first optical axis Ax1. By adjusting a rotating amount of the planar mirror 16', a position of the image in a direction perpendicular to both the first and second optical axes Ax1 and Ax2 (i.e., in the Y-axis direction) can be adjusted.

Also in the configuration shown in FIG. 15, by moving one of the condenser lenses in the direction of the first optical axis Ax1, the magnification of the image can be adjusted. In such a case, by moving the mask 2 and/or the plate 3 in the direction of the first optical axis Ax1, the focusing condition can be adjusted.

It should be noted that the mechanisms for moving the condenser lens and the mirror can be applied to the projecting optical system 110 according to the first embodiment.

The present disclosure relates to the subject matter contained in Japanese Patent Applications No. 2002-162603, filed on Jun. 4, 2002, and NO. 2002-183258, filed on Jun. 24, 2002, which are expressly incorporated herein by reference in their entireties.

What is claimed is:

1. A scanning type projection aligner that projects a pattern formed on a mask onto an image plane at substantially equi-magnification using a plurality of projection optical systems, said image plane being substantially parallel with the mask, the mask and the image plane being movable relative to said plurality of projection optical systems, systems, wherein each of said projection optical system comprises:

a first condenser lens;

a second condenser lens, said first and second condenser lenses having a first optical axis which is common between said first and second condenser lens and perpendicular to the pattern and the image plane;

an imaging lens having a second optical axis that intersects with the first optical axis at an intermediate position between said first and second condenser lenses;

a first mirror that reflects a beam emerged from said pattern and passed through said first condenser lens toward said imaging lens;

a second mirror that is provided in the vicinity of a pupil of said imaging lens and reflects the beam passed through said imaging lens toward said imaging lens; and a third mirror that reflects the beam reciprocally passed through said imaging lens toward said second condenser lens, wherein said imaging lenses included in said plurality of projection optical systems are arranged such that the optical axes thereof are parallel with each other and aligned along a line perpendicular to the first optical axis and the second optical axis, wherein said first condenser lens, said second condenser lens, said first mirror, said second mirror and said third mirror included in one of said plurality of projection optical systems and those included in another one of said plurality of projection optical systems next to said one of said plurality of projection optical systems are arranged at opposite positions with respect to the imaging lenses included therein.

2. The projection optical system according to claim 1, wherein a maximum outer diameter of said imaging lens is less than twice a width of an effective exposure area on said image plane.

3. The projection optical system according to claim 1, wherein a maximum outer diameter of said imaging lens is less than a width of an effective exposure area on said image plane.

4. The projection optical system according to claim 1, wherein said second mirror is a roof mirror.

5. The projection optical system according to claim 4, wherein said roof mirror has two mirror surfaces, a volley line formed between said two mirror surfaces extending substantially in parallel with said first optical axis.

6. A scanning type projection aligner that projects a pattern formed on a pattern onto an imaging surface using a plurality of projection optical systems, said imaging surface being substantially parallel with the mask, each said projection optical system comprising:

a first optical element having an optical power;

a second optical element having an optical power, said first and second optical element having a first optical axis which is common between said first and second optical elements and perpendicular to the pattern and the imaging surface;

an imaging optical system having a second optical axis that intersects with the first optical axis at an intermediate position between said first and second optical elements;

a first mirror that reflects a beam emerged from said pattern and passed through said first optical element toward said imaging optical element;

a second mirror that is provided in the vicinity of a pupil of said imaging optical system and reflects the beam passed through said imaging optical system toward said imaging optical system; and a third mirror that reflects the beam reciprocally passed through said imaging optical system toward said second optical element, wherein at least one of said first and second optical elements is movable in a direction of the first optical axis so as to adjust a magnification of an image projected on said imaging surface, wherein said plurality of projection optical systems are aligned in an a direction perpendicular to both the first and second optical axes, and wherein said first optical element, said second optical element, said first mirror, said second mirror and said third mirror included in one of said plurality of projection optical systems and those included in another one of said plurality of projection optical systems next to said one of said plurality of projection optical systems are arranged at opposite positions with respect to the imaging lenses included therein.

7. A projection optical system for a projection aligner, said projection optical system projecting a pattern on the object side onto an imaging surface at a substantial equi-magnification, said imaging surface being substantially parallel with the pattern, said projection optical system comprising:

a first optical element having an optical power;

a second optical element having an optical power, said first and second optical element having a first optical axis which is common between said first and second optical elements and perpendicular to the pattern and the imaging surface;

an imaging optical system having a second optical axis that intersects with the first optical axis at an intermediate position between said first and second optical elements;

a first mirror that reflects a beam emerged from said pattern and passed through said first optical element toward said imaging optical element;

a second mirror that is provided in the vicinity of a pupil of said imaging optical system and reflects the beam passed through said imaging optical system toward said imaging optical system; and a third mirror that reflects the beam reciprocally passed through said imaging optical system toward said second optical element, wherein at least one of said first and second optical elements is movable in a direction of the first optical axis so as to adjust a magnification of an image projected on said imaging surface.

8. The projection optical system according to claim 7, wherein said imaging surface is movable in the direction of the first optical axis, a focusing condition which changes when said at least one of said first and second optical elements is moved in the direction of the first optical axis being corrected by moving said imaging surface in the direction of the first optical axis.

9. The projection optical system according to claim 7, wherein at least one of the pattern and the imaging surface is movable in the direction of the first optical axis, a focusing condition of the image on the imaging surface being adjustable by moving at least one of the pattern and the imaging surface in the direction of the first optical axis.

10. The projection optical system according to claim 7, wherein at least one of said first and second optical elements is movable in a direction perpendicular to the first optical axis and parallel with the second optical axis, distortion of an image formed on the imaging surface being compensated for by moving said at least one of said first and second optical elements in a direction perpendicular to the first optical axis and parallel with the second optical axis.

11. The projection optical system according to claim 7, wherein at least one of said first and second optical elements is movable in a direction perpendicular to the first optical axis and perpendicular to the second optical axis so that a position of the image formed on said imaging surface is adjustable in a direction perpendicular to beth the first and second optical axes.

12. The projection optical system according to claim 7, wherein said second mirror is a planar mirror having one reflection surface, said second mirror being rotatable about an axis parallel with the first optical axis, a position of the image op said imaging surface in a direction perpendicular to both the first and second optical axes being adjustable by rotating said second minor.

13. The projection optical system according to claim 7, wherein said second mirror is rotatable about an axis perpendicular to both the first and second optical axes, a position of the image on said imaging surface being adjustable in a direction parallel to the second optical axis by rotating said second mirror.

14. The projection optical system according to claim 13, wherein said second mirror is a roof mirror having two reflection surfaces, a volley line between said two reflection surfaces being included in a plane including the first optical axis and the second optical axis.

15. The projection optical system according to claim 7, wherein said second mirror has two reflection surface forming a right angle.

16. The projection optical system according to claim 15, wherein said second mirror is movable about the second optical axis so as to adjust an inclination of the image on said imaging surface.

17. The projection optical system according to claim 7, wherein each of said first and second optical elements has a positive power.

18. The projection optical system according to claim 17, wherein said first and second optical elements function as condenser lenses, said projection optical system being telecentric with respect to the pattern side and the imaging surface side.

* * * * *